US012757696B2

(12) United States Patent
Then et al.

(10) Patent No.: US 12,757,696 B2
(45) Date of Patent: Oct. 6, 2026

(54) SEMICONDUCTOR PACKAGES WITH WETTABLE FLANKS AND RELATED METHODS

(71) Applicant: SEMICONDUCTOR COMPONENTS INDUSTRIES, LLC, Scottsdale, AZ (US)

(72) Inventors: Nam Khong Then, Seremban (MY); Hui Min Ler, Seremban (MY); Phillip Celaya, Gilbert, AZ (US); Chee Hiong Chew, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 350 days.

(21) Appl. No.: 18/625,487

(22) Filed: Apr. 3, 2024

(65) Prior Publication Data

US 2025/0022831 A1 Jan. 16, 2025

Related U.S. Application Data

(60) Provisional application No. 63/513,665, filed on Jul. 14, 2023.

(51) Int. Cl.

| | |
|---|---|
| ***H10W 20/00*** | (2026.01) |
| ***H10W 70/40*** | (2026.01) |
| ***H10W 72/60*** | (2026.01) |
| ***H10W 72/90*** | (2026.01) |
| ***H10W 74/00*** | (2026.01) |
| ***H10W 90/00*** | (2026.01) |

(52) U.S. Cl.

CPC ....... *H10W 20/043* (2026.01); *H10W 70/421* (2026.01); *H10W 90/00* (2026.01); *H10W 90/811* (2026.01); *H10W 72/631* (2026.01); *H10W 72/641* (2026.01); *H10W 72/921* (2026.01); *H10W 72/923* (2026.01); *H10W 72/9415* (2026.01); *H10W 74/00* (2026.01); *H10W 90/754* (2026.01)

(58) Field of Classification Search

CPC . H10W 20/043; H10W 70/421; H10W 90/00; H10W 90/811; H10W 72/631; H10W 72/641; H10W 72/921; H10W 72/923; H10W 72/9415; H10W 74/00; H10W 90/754; H10W 70/457

See application file for complete search history.

(56) References Cited

U.S. PATENT DOCUMENTS

| | | | | |
|---|---|---|---|---|
| 12,224,232 | B2 * | 2/2025 | Lin | H10W 70/457 |
| 2005/0224933 | A1 | 10/2005 | Nurminen | |
| 2009/0057855 | A1 | 3/2009 | Quinones et al. | |
| 2010/0187663 | A1 | 7/2010 | Celaya et al. | |

(Continued)

OTHER PUBLICATIONS

International Search Report and Written Opinion, PCT/US2024/026822, European Patent Office, Aug. 20, 2024.

*Primary Examiner* — J. E. Schoenholtz
(74) *Attorney, Agent, or Firm* — IPTechLaw

(57) ABSTRACT

Implementations of a leadframe for a semiconductor package may include a half-etched gate lead directly coupled to a gate tie bar; a half-etched source lead directly coupled to a source tie bar; and a die flag directly coupled to at least two die flag tie bars. The gate tie bar and the source tie bar may be configured to enable electroplating of a flank of the half-etched gate lead and the half-etched source lead.

20 Claims, 4 Drawing Sheets

(56) References Cited

U.S. PATENT DOCUMENTS

| | | | | |
|---|---|---|---|---|
| 2014/0154843 | A1 | 6/2014 | Liu et al. | |
| 2016/0035651 | A1 | 2/2016 | Leung et al. | |
| 2018/0090421 | A1 | 3/2018 | Thien et al. | |
| 2018/0358286 | A1* | 12/2018 | Cadag | H10W 70/421 |
| 2019/0067172 | A1 | 2/2019 | Carpenter et al. | |
| 2021/0013142 | A1* | 1/2021 | Yeo | H10W 20/43 |
| 2022/0181239 | A1* | 6/2022 | Lin | H10W 70/457 |
| 2022/0208658 | A1* | 6/2022 | Ler | H10W 70/421 |

* cited by examiner

SEMICONDUCTOR PACKAGES WITH WETTABLE FLANKS AND RELATED METHODS

CROSS REFERENCE TO RELATED APPLICATIONS

This application claims the benefit of the filing date of U.S. Provisional Patent Application 63/513,665 entitled "Semiconductor Packages with Wettable Flanks and Related Methods" to THEN et al. which was filed on Jul. 14, 2023, the disclosure of which is hereby incorporated entirely herein by reference.

BACKGROUND

1. Technical Field

Aspects of this document relate generally to semiconductor packages with wettable flanks. More specific implementations involve semiconductor packages that include leadframes.

2. Background

Semiconductor packages have been devised to assist with providing electrical connections between a semiconductor device and a circuit board or other motherboard. Some semiconductor packages also may protect a semiconductor device from shock or vibration. Other semiconductor packages may be constructed to prevent damage to a semiconductor device from electrostatic discharge.

SUMMARY

Implementations of a leadframe for a semiconductor package may include a half-etched gate lead directly coupled to a gate tie bar; a half-etched source lead directly coupled to a source tie bar; and a die flag directly coupled to at least two die flag tie bars. The gate tie bar and the source tie bar may be configured to enable electroplating of a flank of the half-etched gate lead and the half-etched source lead.

Implementations of leadframe for a semiconductor package may include one, all, or any of the following:

The portion of the die flag may be half-etched.

At least one of the gate tie bar, the source tie bar and the two die flag tie bars may be half-etched.

At least one of the half-etched source lead and the half-etched gate lead may be a flat lead.

The half-etched source lead and the half-etched gate lead may be flat leads.

The die flag further may include one or more leads and the at least two die flag tie bars may be configured to allow for electroplating of a flank of the one or more leads.

Implementations of a method of forming a semiconductor package may include half etching a gate lead directly coupled to a gate tie bar; half etching at least one source lead directly coupled to a source tie bar; and half etching a portion of a die flag directly coupled to at least two die flag tie bars. The method may include cutting the gate lead and the at least one source lead; electroplating a flank of the gate lead using only the gate tie bar; and electroplating a flank of the at least one source lead using only the source tie bar.

Implementations of a method of forming a semiconductor package may include one, all, or any of the following:

The method may include applying a mold compound over the gate lead, the at least one source lead, and the die flag prior to cutting the gate lead and the at least one source lead.

Cutting the gate lead and the at least one source lead may occur prior to electroplating the flank of the gate lead and the flank of the at least one source lead.

The method may include electroplating a flank of one or more leads included in the die flag using the at least two die flag tie bars.

Implementations of a method of forming a semiconductor package may include providing a gate lead directly coupled to a gate tie bar; providing a source lead directly coupled to a source tie bar; and maximizing a size of a die flag by half-etching the gate lead, half-etching the source lead, and half-etching the die flag, the die flag being directly coupled to at least two die flag tie bars. The method may also include cutting the gate lead and the source lead.

Implementations of a method of forming a semiconductor package may include one, all, or any of the following:

The method may include applying a mold compound over the gate lead, the source lead, and the die flag prior to cutting the gate lead and the source lead.

The method may include electroplating a flank of the gate lead using only the gate tie bar.

The method may include electroplating a flank of the source lead using only the source tie bar.

Cutting the gate lead may occur prior to electroplating the flank of the gate lead.

Cutting the source lead may occur prior to electroplating the flank of the source lead.

The method may include cutting one or more leads included in the die flag.

The method may include electroplating a flank of the one or more leads included in the die flag using the at least two die flag tie bars.

At least one of the source lead and the gate lead may be a flat lead.

The source lead and the gate lead may be flat leads.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
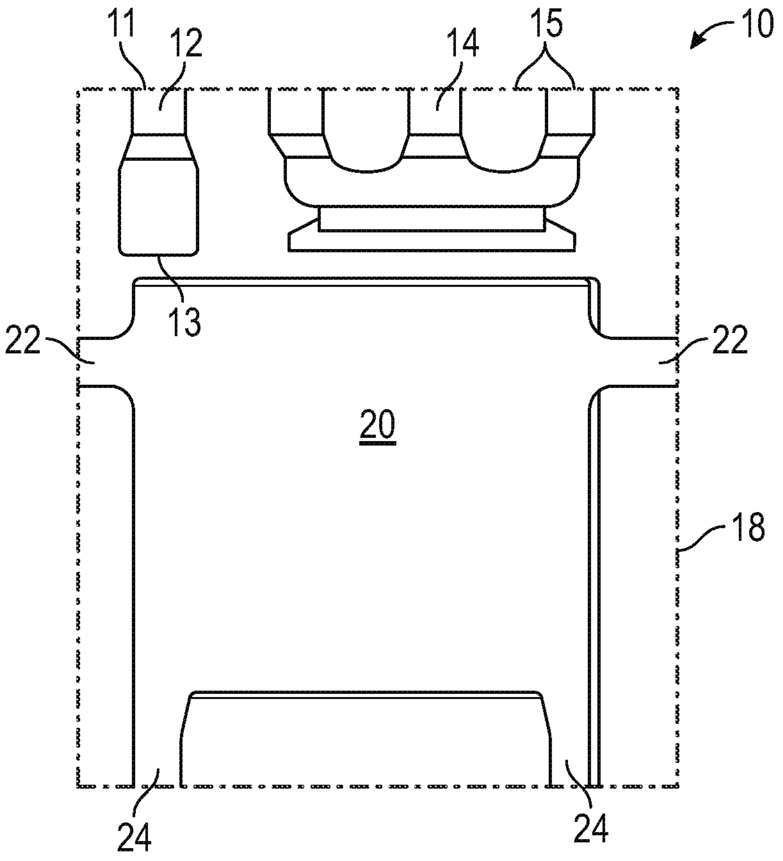
FIG. 1 is a schematic view of an implementation of a semiconductor package following singulation from a leadframe.

This disclosure, its aspects and implementations, are not limited to the specific components, assembly procedures or method elements disclosed herein. Many additional components, assembly procedures and/or method elements known in the art consistent with the intended semiconductor packages that include wettable flanks and leadframes will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages that include wettable flanks and leadframes, and implementing components and methods, consistent with the intended operation and methods.

Semiconductor devices are typically fabricated using a process that starts with a semiconductor wafer. The wafers are subject to numerous fabrication steps including doping, deposition, patterning and photolithography, and etching until the desired characteristics of the semiconductor devices are obtained. After fabrication of the semiconductor devices on the wafer, the wafer is diced to form individual chips or die, which are mounted to packaging substrates. Semiconductor packages include electrical leads that provide electrical pathways between the electrical component of the die housed within the package and external electronic devices, so the die inside the package can communicate with the external electronic devices. External electronic devices may include, for example, printed circuit boards.

Leadframes are a type of packaging substrate used to connect die to external electronic devices. Leadframes are metal structures that during fabrication, result in the formation of electrical terminals known as "leads." The leads/electrical terminals carry electrical signals from the die to the periphery/exterior surfaces of the semiconductor package so the semiconductor die can be connected to external electronic device components. Semiconductor packages including leadframes are typically encapsulated/molded using a mold compound to protect the electrical components from mechanical or electrical damage.

Various semiconductor package designs and related methods of creating wettable flanks on the leads of those packages are disclosed in U.S. Pat. App. Pub. No. 20180090421 to Thien et al, application Ser. No. 15/278,203, entitled "Long-Lasting Wettable Flanks," filed Sep. 28, 2016, (the '421 Publication) the disclosure of which is hereby incorporated entirely by reference herein. The use of electroplating to form a solder wettable layer on leads derived from a leadframe assists with ensuring reliable soldered connections are formed between the leads and the circuit board/motherboard to which the semiconductor package is ultimately attached. The use of electroplating also can form a layer which is more easily visually inspectable than the material of the leads themselves which can help with quality assurance during the assembly process. As discussed in the '421 Publication, an electrical connection between a lead and the leadframe needs to be present to allow the electroplating reaction to take place in the bath by completing the electrical circuit in the bath.

In various semiconductor package implementations, the lead frame leads can be plated with tin and cut to separate the substrate into individual semiconductor packages. The exposed portions of the cut lead frame materials may be subject to corrosion which results in poor or reduced wettability because the exposed portions are not coated with tin, but include just the material of the leadframe itself (copper, aluminum, etc.). The decrease in wettability of the exposed portions or flanks of the leads impacts the solder joints formed between the semiconductor package and external electronic components. The resulting solder joints may be unable to withstand corrosion creep during extreme atmospheric conditions such as those within an automotive engine compartment.

Figure 2:
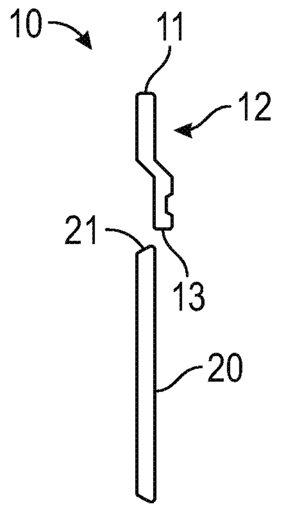
FIG. 2 is a side view of the semiconductor package of FIG. 1 illustrating upset leads.
Figure 3:
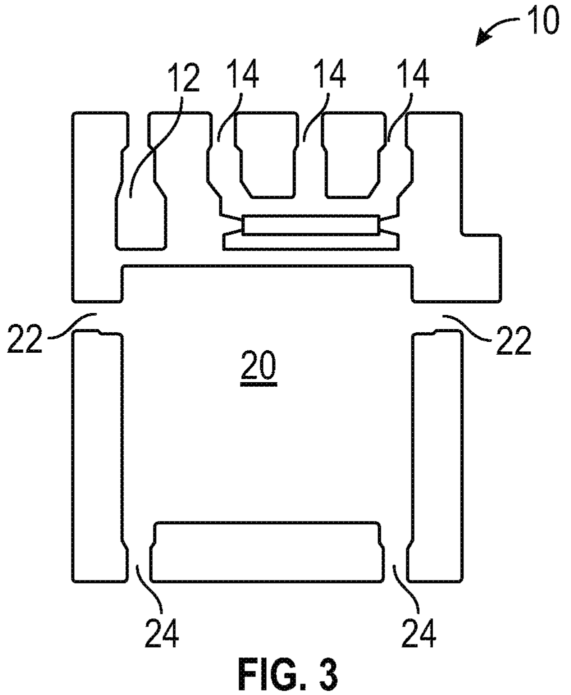
FIG. 3 is a top view of the semiconductor package of FIG. 1.

Referring now to FIGS. 1 to 3, an implementation of a semiconductor package following singulation from a lead frame is illustrated. The semiconductor package includes a lead frame 10 having electrical terminals/leads 12, 14 (e.g., gate lead 12 and source leads 14) extending away from a die flag 20. Electrical leads 14 are electrically coupled to one another by being physically attached to each other while electrical terminal/lead 12 is electrically isolated from electrical leads 14 by not being physically attached to them. Leadframe 10 also includes electrical leads 24 and die flag tie bars 22 attached to die flag 20. Die flag tie bars 22 are used to both physically support die flag 20 in position during package formation and may, in some package implementations, also provide an electrical connection to die flag 20 when a solder wettable layer is formed over ends of cut electrical leads 24 during package formation.

Cutting line 18 is illustrated in FIG. 1 indicating the position at which cutting of the tie bars 22 and terminals/leads 12, 14, 24 takes place to singulate the package from lead frame 10. After cutting is completed, lead 12 includes a cut end or flank 11 and leads 14 also include cut ends or flanks 15.

While not illustrated in FIGS. 1 to 3, electrical leads 12, 14 can be electrically connected to die flag 20 via a semiconductor die mounted on die flag 20 through bond wires and using clip connecting one or more pads of the die 20 to leads 12, 14.

FIG. 2 illustrates a side view of lead frame 10. As shown in FIG. 2, leads 12, 14 are upset leads, meaning that they are bent upwardly above the level of the die flag 20. Lead 12 is configured such that an end 13 of lead 12 nearest to an end 21 of die flag 20 is elevated with respect to the distal, cut end or cut flank 11 of lead 12 that is away from die flag 20. Flank 11 of lead 12 and the lower portion of lead 12 can electrically connect semiconductor package 10 to an external electronic device. Near end 13 of the lead 12 is configured to electrically connect to a die on die flag 20. In various implementations, near end 13 of electrical lead 12 connects to a die on die flag 20 via a bond wire through a wirebond.

The various components of the lead frame 10 including, for example, die flag 20, die flag tie bars 22, and electrical leads 12, 14, 24 all are preferably composed of the same or similar electrically conductive material, such as copper or a copper alloy or aluminum.

The design of lead frame 10 depicted in the figures herein is merely illustrative. The techniques described herein are not limited to application in lead frames having a design similar or identical to that shown in the figures. On the contrary, the disclosed techniques may be applied to any and all suitable package lead frames that may benefit from flank plating that is resistant to corrosion and migration. For instance and without limitation, in some implementations, the electrical leads of lead frame 10 may all be electrically coupled to each other. In some implementations, some electrical leads may electrically couple to each other while other electrical leads are isolated. In some implementations, multiple groups of inter-connected electrical leads may be formed, but the groups may be electrically isolated from each other. In various implementations, however, each electrical lead to be plated couples either directly or indirectly to at least one tie bar.

Figure 4:
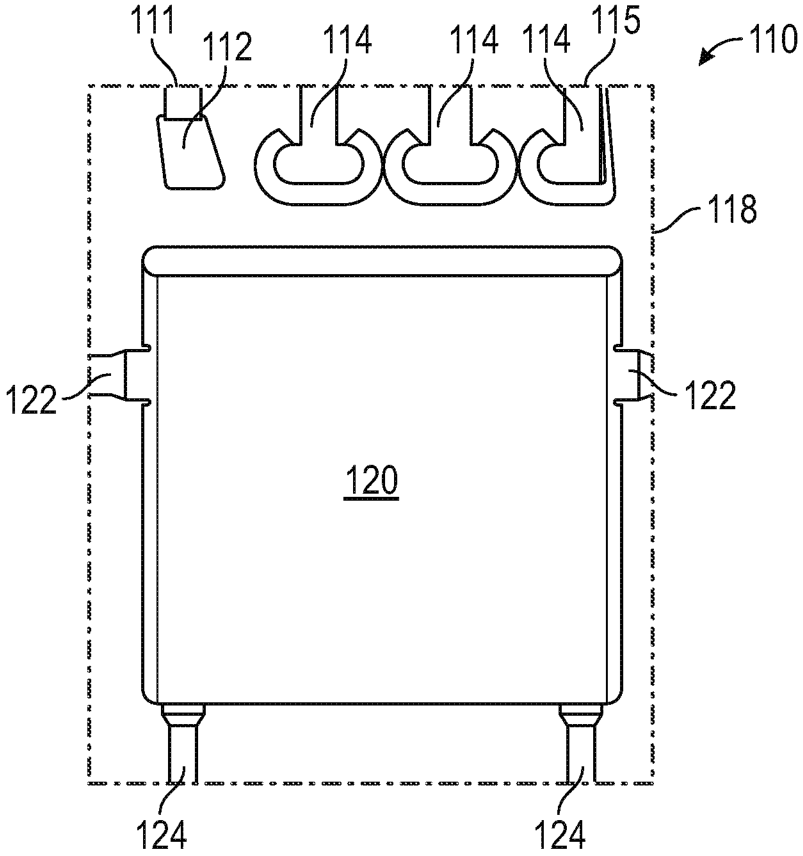
FIG. 4 is a schematic view of another implementation of a semiconductor package following singulation from a leadframe and completion of a molding process.
Figure 5:
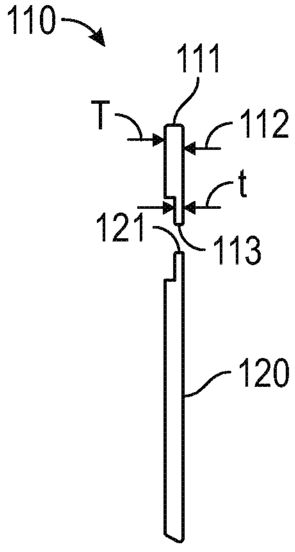
FIG. 5 is a side view of the semiconductor package of FIG. 4 illustrating flat, half etched leads.
Figure 6:
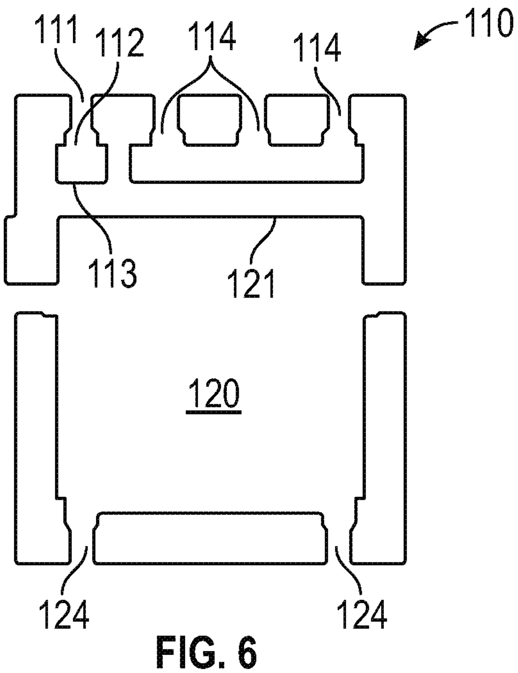
FIG. 6 is a top view of the semiconductor package of FIG. 4.

Referring now to FIGS. 4 to 6, an implementation of a semiconductor package following singulation from a leadframe is illustrated. Semiconductor package includes a lead frame 110 having electrical leads 112, 114 (e.g., gate lead 112 and source leads 114) extending away from a die flag 120. Electrical leads 114 are electrically coupled to one another while electrical lead 112 is electrically isolated from electrical leads 114. Leadframe 110 also includes electrical leads 124 and die flag tie bars 122 attached to die flag 120. Die flag tie bars 122 are used to both physically support die flag 120 in position during package formation and to provide an electrical connection to die flag 120 when a solder wettable layer is formed over ends of cut leads 124 during package formation.

Cutting line 118 is illustrated in FIG. 4 showing the location where cutting of tie bars 122 and leads 112, 114, 124 takes place to singulate the package from lead frame 110. After cutting, lead 112 includes a cut end/flank 111 and leads 114 include cut ends/flanks 115.

While not illustrated in FIGS. 4 to 6, electrical leads 112, 114 can electrically connect to die flag 120 via bond wire to a die mounted on die flag 120 or a clip bond/clip.

FIG. 5 illustrates a side view of lead frame 110. As shown in FIG. 5, electrical leads 112, 114 are flat, half etched leads instead of upset leads. As illustrated, electrical lead 112 is aligned such that an end 113 of lead 112 nearest to end 121 of die flag 120 is approximately level with respect to a flank or distal end 111 of lead 112 that is away from die flag 120. As further illustrated, near end 113 is half etched or half coined. While the term "half etched' is used in this document, the actual amount of the thickness of the lead 112 remaining following etching or coining may be more, less, or exactly half of the thickness. In other words, a portion of material on near end 113 has been thinned with respect to a remaining portion of lead 112 and cut flank 111. Cut flank 111 and a remaining portion of lead 112 have a thickness T which is greater than a thickness t of distal end 113. While not illustrated, leads 114 are configured similarly to lead 112 having a half etched end near die flag 120. Similarly, a half-etched portion of an end 121 of die flag 120 has been thinned with respect to a remaining portion of die flag 120.

Cut flank 111 can electrically connect semiconductor package 110 to an external electronic device while the flat, half etched near end 113 is used to electrically connect to a die on die flag 120. In various implementations, near end 113 of lead 112 connects via a wire bond or clip to a semiconductor die attached or bonded onto die flag 120. The use of flat leads/changes the design of the clip used with the semiconductor package and can increase a maximum size of the die flag that can be included in the package. This increase in the maximum size of the die flag 120 happens by shortening a length of leads 112, 114 which allows the area of die flag 120 to be increased for the same given semiconductor package size. As illustrated, electrical leads 112, 114 of FIGS. 5 and 6 are shorter than electrical leads 12, 14 of FIGS. 2 and 3, which allows for an area of die flag 120 to be greater than an area of die flag 20, for a same package size. While the use of half etched or half coined leads/leads is illustrated in FIG. 5, thinned leads/leads may be utilized that are thinner than half etched or thicker than half etched in this implementation and the other thinned lead/lead implementations disclosed in this document.

The various components of the lead frame 110 including, for example, die flag 120, die flag tie bars 122, and electrical leads 112, 114, 124, all may be composed of the same or similar electrically conductive material, such as copper or a copper alloy or an aluminum material.

Figure 7:
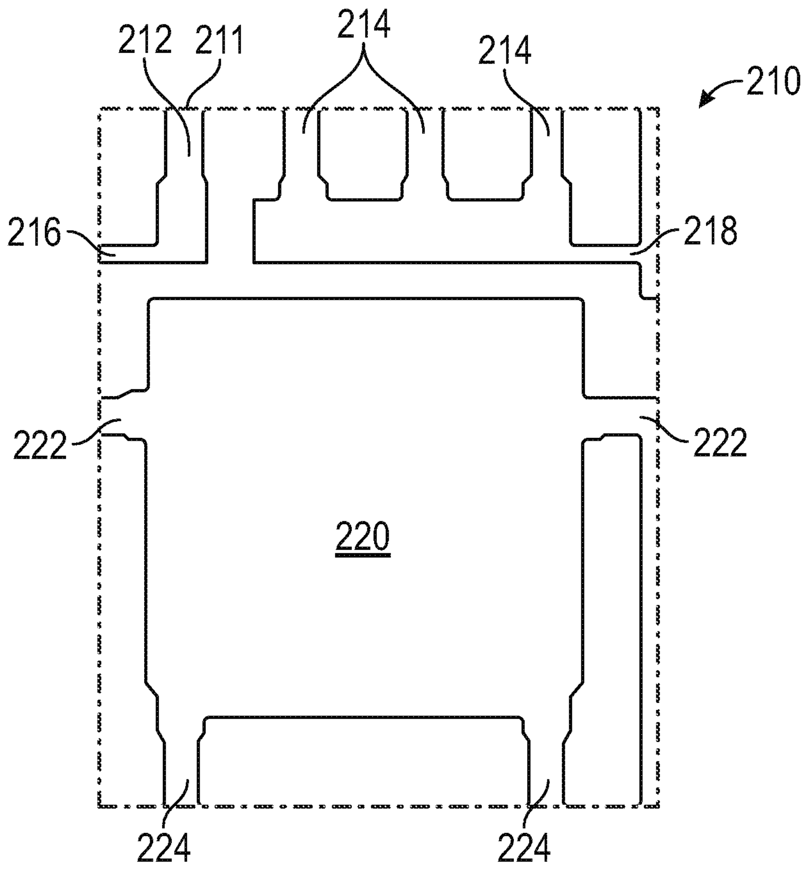
FIG. 7 is a schematic view of an implementation of a semiconductor package prior to lead cutting illustrating tie bars directly attached to the gate lead and to the source lead of the package.
Figure 8:
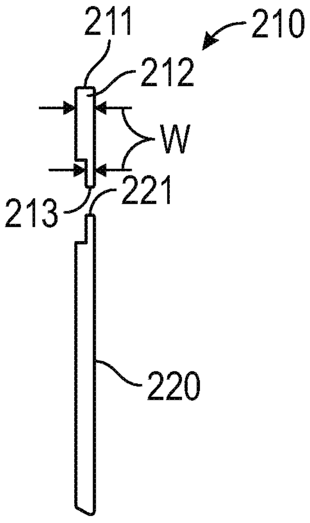
FIG. 8 is a side view of the semiconductor package of FIG. 7 illustrating flat, half etched leads.
Figure 9:
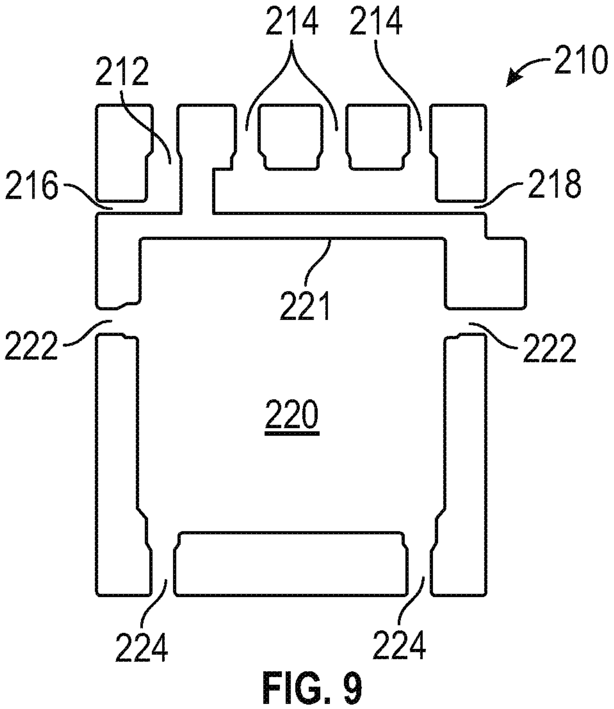
FIG. 9 is a top view of the semiconductor package of FIG. 7.

Referring now to FIGS. 7 to 9, an implementation of a semiconductor package having tie bars directly attached to electrical leads is illustrated. FIGS. 7-9 are illustrated prior to singulation of the various leads and tie bars. Semiconductor package includes a lead frame 210 having electrical leads 212, 214 (e.g., gate lead 212 and source leads 214) extending away from a die flag 220. Electrical leads 214 are electrically coupled to one another by being physically attached to each other/integral with one another while electrical lead 212 is electrically isolated from electrical leads 214 by being physically separated from the leads 214. Electrical leads 214 are directly attached to a source tie bar 218 and electrical lead 212 is directly attached to a gate tie bar 216. Tie bars 216, 218 are used for physical support of electrical leads 212, 214, respectively, and also used for electroplating as will be described hereafter.

Leadframe 210 also includes electrical leads 224 and die flag tie bars 222 attached to die flag 220. Die flag tie bars 222 are used to both physically support die flag 220 in position during package formation and to provide an electrical connection to die flag 220 when a solder wettable layer is formed over flanks or ends of cut leads 224 during package formation. From the top views illustrated in FIGS. 7 and 9, it is apparent that tie bars 216, 218 are thinner/smaller in top dimension than die flag tie bars 222 used for die flag 220 because, in particular implementations, gate tie bar 216 and source tie bar 218 are not intended to be used to form electrical connections with the circuit board/motherboard to function as actual leads/leads. This is so even though cut ends of the gate tie bar 216 and source time bar 218 will remain exposed through the mold compound of the finished semiconductor package.

While not shown in FIGS. 7 to 9, electrical leads 212, 214 can electrically connect to die flag 220 via a bond wire wirebonded with a semiconductor die mounted on die flag 220 and through a clip a clip that connects the semiconductor die attached/bonded to die flag 220. This structure will be illustrated and discussed hereafter.

FIG. 8 illustrates a side view of lead frame 210. As illustrated in FIG. 8, leads 212, 214 are flat, half etched leads/instead of upset leads/. Lead 212 is arranged such that an end 213 of lead 212 nearest to die flag 220 is approximately level with respect to a distal end or flank 211 of lead 212 that is away from die flag 220. As further illustrated, near end 213 is half etched or half coined such that a portion of material on near end 213 has been thinned with respect to a remainder of lead 212 and flank 211. The half etching/coining in this implementation may be the same as in the other implementations disclosed herein. Flank 211 and a remaining portion of lead 212 have a thickness W which is greater than a thickness w of distal end 213. While not illustrated, leads 214 are configured similarly to lead 212 having a half etched end near die flag 220. Similarly, a half-etched portion of an end 221 of die flag 220 means that a portion of the die flag 220 has been thinned with respect to the remaining portion of die flag 220.

Flank 211 along with the remaining portion of lead 212 is used to electrically connect semiconductor package 210 to an external electronic device. The flat, half etched near end 213 is used to electrically connect to a semiconductor die on die flag 220. via a bond wire or a clip. As discussed above, using flat leads/leads changes a design of the clip used with the semiconductor package and thus allow for increasing of a maximum size of die flag 220 that can be included in the package for the same semiconductor package size. As illustrated, electrical leads 212, 214 of FIGS. 8 and 9 are shorter than electrical leads 12, 14 of FIGS. 2 and 3, which allows for an area of die flag 220 to be be expanded to be larger than the area of die flag 20, for a same package size. While the use of half etched or half coined leads/leads is illustrated in FIG. 8, thinned leads/leads may be utilized that are thinner than half etched or thicker than half etched in this implementation and the other thinned lead/lead implementations disclosed in this document. Since FIG. 7 illustrates the die flag 220 after its half etched portion has been covered by mold compound it appears smaller than it actually is. In reality, the size of the die flag 220 is similar to that of die flag 420 illustrated in FIG. 11, which is markedly larger than the die flag 32 illustrated in FIG. 10 or die flag 20 illustrated in FIG. 1.

The various components of the lead frame 210 including, for example, die flag 220, die flag tie bars 222, electrical leads 212, 214, 224, gate tie bar 216, and source tie bar 218 all are preferably composed of the same or similar electrically conductive material, such as copper or a copper alloy.

Figure 10:
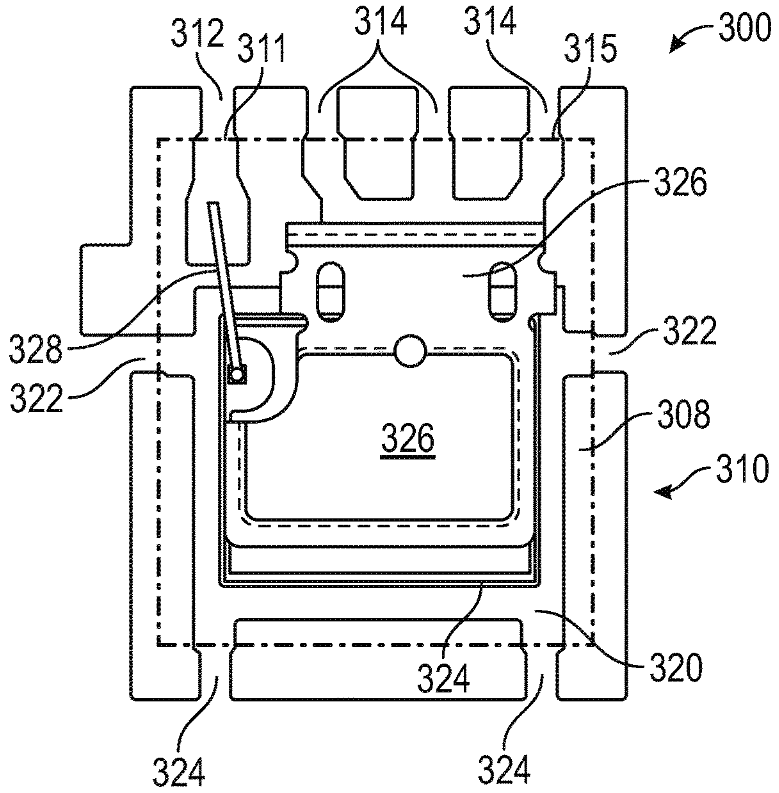
FIG. 10 is a schematic view of an implementation of a semiconductor package like that illustrated in FIG. 1 following bonding of a semiconductor die to the die flag and bonding of a clip over the semiconductor die.

FIG. 10 illustrates an implementation of a semiconductor package 300 like that illustrated in FIG. 1 following bonding of a semiconductor die 324 to die flag 320 and bonding of a clip 326 over semiconductor die 324. Semiconductor package 300 includes a lead frame 310 having electrical leads 212 (e.g., gate lead 312 and source leads 314) extending away from die 324 on die flag 320. Electrical leads 314 are electrically coupled to one another while electrical lead 312 is electrically isolated from electrical leads 314. Electrical leads 314 are electrically connected to semiconductor die 324 via a clip bond 326 and lead 312 is electrically connected to semiconductor die 324 by wirebonding with a wire bond 328. Leadframe 310 also includes electrical leads 324 and die flag tie bars 322 attached to die flag 320. Die flag tie bars 322 are used to both physically support die flag 320 in position during package formation and to provide an electrical connection to die flag 320 when a solder wettable layer is formed over ends of cut leads 324 during package formation. Cutting line 308 is illustrated to indicate where lead frame 310 including leads 312, 314, 324 and tie bars 322 are cut. During package formation 311, 315 flanks of leads 312, 314 do not include a solder wettable layer initially as the exposed metal is just the material of the leadframe itself. However, the cut flanks 311, 315 of leads 312, 314 cannot be electroplated because leads 312, 314 are electrically isolated post-cutting and no electrical connection to the leads can be formed. Consequently, an electroless sidewall tin plating process is required to provide a solder wettable layer on cut flanks 311, 315 of leads 312, 314.

The various semiconductor package implementations illustrated in FIGS. 1 to 3 and 10 can be created using various implementations of a method of forming a semiconductor package. Specifically, the method requires an additional electroless plating process post-trimming/cutting of the tie bars to provide solder wettable material on the flanks of the exposed (trimmed and cut) leads/leads. This method implementation also includes a dry packing operation following final test used to prevent corrosion of the electrolessly plated metal layer on the flanks of the leads. The challenge with this process is that electroless plating can be more expensive than electroplating and often involves the use of subcontracted services as a result. Accordingly, a way to use electroplating instead of electroless plating could result in lower costs and reduction in processing steps overall.

Figure 11:
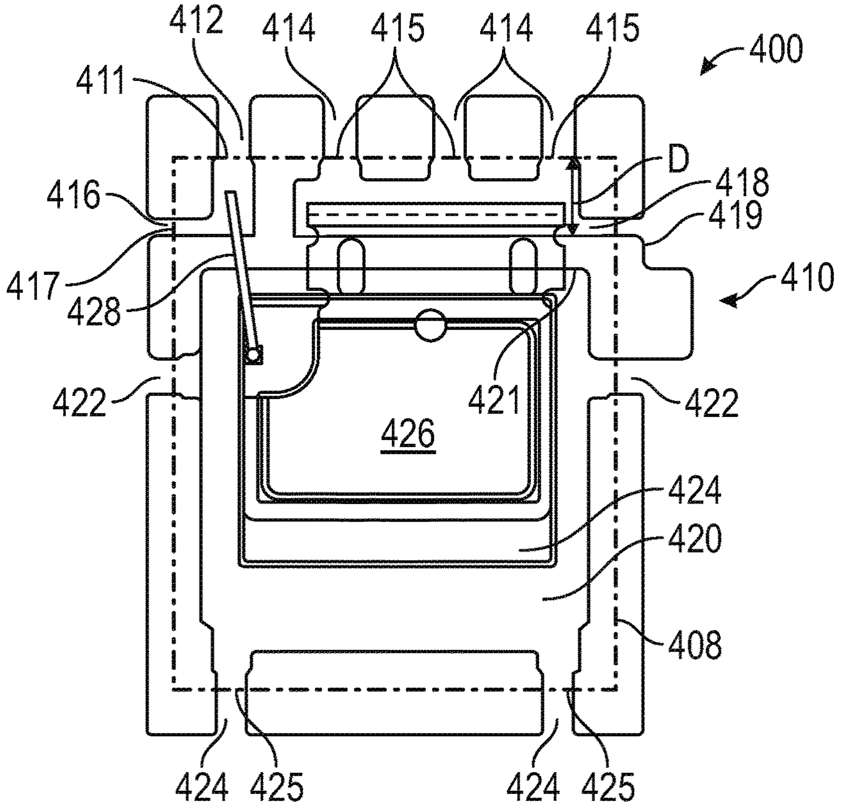
FIG. 11 is a schematic view of an implementation of a semiconductor package like that illustrated in FIG. 7 following bonding of a semiconductor die to the die flag and bonding of a clip over the semiconductor die.

FIG. 11 illustrates an implementation of a semiconductor package 400 like that illustrated in FIG. 7 following bonding of a semiconductor die 424 to die flag 420 and bonding of a clip 426 over semiconductor die 424. Semiconductor package 400 includes a lead frame 410 having electrical leads 412, 414 (e.g., gate lead 412 and source leads 414) extending away from die 424 on die flag 420. Electrical leads 414 are electrically coupled to one another by being physically/integrally connected with each other while electrical lead 412 is electrically isolated from source leads 414 by being physically apart from the source leads 414. Leads 414 are electrically connected to semiconductor die 424 via a bond clip 426 and electrical lead 412 is electrically connected to semiconductor die 424 by wirebonding with a wire bond 428. Electrical leads 414 are directly attached to a source tie bar 418 and electrical lead 412 is directly attached to a gate tie bar 416. Tie bars 416, 418 are used for physical support of leads 212, 214, respectively, but are used primarily for electroplating as will be described hereafter. From the top view illustrated in FIG. 11, it is apparent that tie bars 416, 418 are thinner/smaller in top dimension than die flag tie bars 422 used for die flag 420 because, in particular implementations, gate tie bar 416 and source tie bar 418 are not intended to be used to form electrical connections with the circuit board/motherboard/external electronic device to function as actual leads/leads. As illustrated, wire bond 428 and clip 426 are used to electrically connect electrical leads 412, 414 to semiconductor die 424, respectively.

Leadframe 410 also includes leads 424 and die flag tie bars 422 attached to die flag 420. Die flag tie bars 422 are used to both physically support die flag 420 in position during package formation and to provide an electrical connection to die flag 420 when a solder wettable layer is formed over ends of cut leads 424 during package formation. Cutting line 408 is illustrated to indicate where lead frame 410 including leads 412, 414, 424 and tie bars 416, 418, 422 are cut.

The presence of gate tie bar 416 and source tie bar 418 reduces a size of electrical lead 412 and a depth D that source leads 414 extend into semiconductor package 400, as illustrated. In various implementations, gate tie bar 416 may act as a mold lock to reduce the opportunities for lead 412 to pull out or otherwise move during subsequent processing operations. A result of having smaller electrical leads 412, 414 can be that a size of die flag 420 can be larger for a same package size/cutting line size. Providing a larger die flag allows for a larger semiconductor die 424 to be included in semiconductor package 400 and/or for the size of the exposed pad of the die flag to be increased. Furthermore, as will be described hereafter, using additional tie bars 416, 418 permits the otherwise electrically isolated lead 412 and electrically connected leads 414 to be available for electroplating through the electrical connection provided by the gate tie bar 416 and source tie bar 418, to each lead 412, 414, respectively.

The ability to use flat leads/leads as illustrated in FIGS. 5 and 8 rather than upset or downset leads/leads illustrated in FIG. 2 decreases a size of the gate and source leads/leads and/or helps simplify the design of clips used. Using flat leads/leads may also work to decrease a thickness of the semiconductor package design, particularly where thinned semiconductor die are included in the package.

The various semiconductor package implementations illustrated in FIGS. 7 to 9 and 11 can be created using various implementations of a method of forming a semiconductor package.

Advantageously, the various semiconductor package implementations illustrated in FIGS. 7 to 9 and 11 can be created by cutting the gate lead/lead and source leads/leads after molding and post mold cure (PMC) followed by electroplating of the flanks on the leads/leads. Referring now to FIG. 11, during electroplating, the die flag 420 is held in place using just the two remaining die flag tie bars 422 to allow the two die flag leads/leads 424 at the end of the die flag 420 to be plated. The flank 411 of gate lead/lead 412 and the flanks 415 of source leads/leads 414 are also electroplated via tie bars 416, 418 still attached to each lead 412, 414, respectively, even after cutting of the leads/leads 412, 414 represented by cutting line 408 otherwise would electrically isolate them.

Following electroplating of leads/leads 412, 414, 424, the package 400 is trimmed to cut the remaining tie bars 416, 418, 422 to fully singulate semiconductor package 400. Flanks 417, 419 of cut tie bars 416, 418, respectively, are thus not covered with any electroplated solder wettable material when package 400 is finished in contrast with flanks 411, 415, 425 of leads/leads 412, 414, 424, respectively, which all include a layer of solder wettable material. As a result, this method implementation does not require or include an electroless plating operation nor a dry pack operation because the solder wettable material was able to be formed on flanks 411, 415, 425 in the same electroplating operation.

In various implementations a method of forming a semiconductor package includes half etching a gate lead/lead directly coupled to a gate tie bar, half etching at least one source lead/lead directly coupled to a source tie bar and half etching a portion of a die flag directly coupled to at least two die flag tie bars, cutting the gate lead/lead and the source lead/lead, electroplating a flank of the gate lead/lead using only the gate tie bar, and electroplating a flank of the source lead/lead using only the source tie bar.

The method may include further features, taken alone or in combination, such as, applying a mold compound over the gate lead/lead, the source lead/lead, and the die flag prior to cutting the gate lead/lead and the source lead/lead, cutting the gate lead/lead and the source lead/lead prior to electroplating the flank of the gate lead/lead and the flank of the source lead/lead and electroplating a flank of one or more leads/lead comprised in the die flag using the at least two die flag tie bars.

In further implementations a method of forming a semiconductor package includes providing a gate lead/lead directly coupled to a gate tie bar, providing a source lead/lead directly coupled to a source tie bar, maximizing a size of a die flag by half-etching the gate lead/lead, half-etching the source lead/lead and half-etching the die flag, the die flag being directly coupled to at least two die flag tie bars and cutting the gate lead/lead and the source lead/lead.

The method implementations may further include the following features, taken alone or in combination: applying a mold compound over the gate lead/lead, the source lead/lead, and the die flag prior to cutting the gate lead/lead and the source lead/lead. The mold compound may be any mold compound type disclosed in this document, including, by non-limiting example, a resin, polymer, epoxy, colorant, binder, particulate material, or any combination thereof. The method may also include electroplating a flank of the gate lead/lead using only the gate tie bar. The electroplating process here occurs simultaneously with the electroplating of a flank of the source lead/lead using only the source tie bar. In various method implementations, cutting the gate lead/lead occurs prior to electroplating the flank of the gate lead/lead; and cutting the source lead/lead occurs prior to electroplating the flank of the source lead/lead.

For those implementations of die flags that also include leads (rather than just a single pad), the method may include cutting one or more leads/leads comprised in the die flag and electroplating a flank of the one or more leads/leads comprised in the die flag using the at least two die flag tie bars. In various method implementation, at least one of the source lead and the gate lead is a flat lead; and the source lead/lead and the gate lead/lead are flat leads/leads.

The various method implementations disclosed herein may also utilize a method of maximizing a size of a die flag. As previously discussed, the method includes half etching the gate lead, the source lead(s), and the die flag, allowing the use of flat rather than upset or downset leads in the structure of the package. As a result, the internal length/dimensions of the gate lead and the source lead(s) can be reduced, allowing the die flag to grow in size for the same package dimension. In this way, the half etching of the leads enables the increase in the size of the die flag.

While the use of tin as a solder wettable material that is electroplated is illustrated in the various examples in this document, any other solder wettable material or layers of solder wettable materials may be used in various implementations that are capable of being deposited using electroplating.

A tooling design implementation that is designed to help aid with the use of punching at the tie bar singulation process may be utilized in some implementations. As discussed, the use of half etched/half coined leads means that mold compound extends along the length of the tie bars which chips when cut using ordinary 0.125 mm sized carving cutting die. To prevent the chipping and exposed tie bar metal defects observed at the tie bar locations, the use of a 0.02 mm sized carving cutting die is used instead, a smaller or larger size may be employed in various implementations.

While the use of cutting and punching is disclosed for cutting the tie bars in this document, in the various system and method implementations disclosed herein other methods of singulating the tie bars may be used. The methods may include, by non-limiting example, water jet cutting, laser scribing, water guide laser cutting, air jet cutting, air jet cutting with abrasive particles, sawing, or any other method of singulating the metal and/or mold compound of the tie bars.

In places where the description above refers to particular implementations of semiconductor packages that include leadframes and implementing components, sub-components, methods and sub-methods, it should be readily apparent that a number of modifications may be made without departing from the spirit thereof and that these implementations, implementing components, sub-components, methods and sub-methods may be applied to other semiconductor packages that include leadframes.

What is claimed is:

1. A leadframe for a semiconductor package comprising:
a half-etched gate lead directly coupled to a gate tie bar;
a half-etched source lead directly coupled to a source tie bar; and
a die flag directly coupled to at least two die flag tie bars;
wherein, the gate tie bar and the source tie bar are configured to enable electroplating of a flank of the half-etched gate lead and the half-etched source lead.

2. The leadframe of claim 1, wherein a portion of the die flag is half-etched.

3. The leadframe of claim 1, wherein at least one of the gate tie bar, the source tie bar and the two die flag tie bars are half-etched.

4. The leadframe of claim 1, wherein at least one of the half-etched source lead and the half-etched gate lead is a flat lead.

5. The leadframe of claim 1, wherein the half-etched source lead and the half-etched gate lead are flat leads.

6. The leadframe of claim 1, wherein the die flag further comprises one or more leads and the at least two die flag tie bars are configured to allow for electroplating of a flank of the one or more leads.

7. A method of forming a semiconductor package comprising:
half etching a gate lead directly coupled to a gate tie bar;
half etching at least one source lead directly coupled to a source tie bar; and
half etching a portion of a die flag directly coupled to at least two die flag tie bars;
cutting the gate lead and the at least one source lead;
electroplating a flank of the gate lead using only the gate tie bar; and
electroplating a flank of the at least one source lead using only the source tie bar.

8. The method of claim 7, further comprising applying a mold compound over the gate lead, the at least one source lead, and the die flag prior to cutting the gate lead and the at least one source lead.

9. The method of claim 7, wherein cutting the gate lead and the at least one source lead occurs prior to electroplating the flank of the gate lead and the flank of the at least one source lead.

10. The method of claim 7, further comprising electroplating a flank of one or more leads comprised in the die flag using the at least two die flag tie bars.

11. A method of forming a semiconductor package comprising:
providing a gate lead directly coupled to a gate tie bar;
providing a source lead directly coupled to a source tie bar;
maximizing a size of a die flag by half-etching the gate lead, half-etching the source lead, and half-etching the die flag, the die flag being directly coupled to at least two die flag tie bars; and
cutting the gate lead and the source lead.

12. The method of claim 11, further comprising applying a mold compound over the gate lead, the source lead, and the die flag prior to cutting the gate lead and the source lead.

13. The method of claim 11, further comprising electroplating a flank of the gate lead using only the gate tie bar.

14. The method of claim 11, further comprising electroplating a flank of the source lead using only the source tie bar.

15. The method of claim 13, wherein cutting the gate lead occurs prior to electroplating the flank of the gate lead.

16. The method of claim 14, wherein cutting the source lead occurs prior to electroplating the flank of the source lead.

17. The method of claim 11, further comprising cutting one or more leads comprised in the die flag.

18. The method of claim 17, further comprising electroplating a flank of the one or more leads comprised in the die flag using the at least two die flag tic bars.

19. The method of claim 11, wherein at least one of the source lead and the gate lead is a flat lead.

20. The method of claim 11, wherein the source lead and the gate lead are flat leads.

* * * * *